United States Patent
Hitomi et al.

(10) Patent No.: US 7,560,980 B2
(45) Date of Patent: Jul. 14, 2009

(54) CONSTANT VOLTAGE GENERATING CIRCUIT

(75) Inventors: Masahiko Hitomi, Saitama (JP); Masashi Shimozuru, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 9 days.

(21) Appl. No.: 11/663,997

(22) PCT Filed: Sep. 29, 2005

(86) PCT No.: PCT/JP2005/018014

§ 371 (c)(1),
(2), (4) Date: Mar. 28, 2007

(87) PCT Pub. No.: WO2006/035898

PCT Pub. Date: Apr. 6, 2006

(65) Prior Publication Data

US 2008/0018386 A1    Jan. 24, 2008

(30) Foreign Application Priority Data

Sep. 30, 2004    (JP) ............................. 2004-285925

(51) Int. Cl.
*G05F 1/10* (2006.01)
(52) U.S. Cl. ...................................... 327/540; 323/316
(58) Field of Classification Search ......... 327/538–543; 323/316
See application file for complete search history.

(56) References Cited

U.S. PATENT DOCUMENTS

| | | | | |
|---|---|---|---|---|
| 5,592,121 A | * | 1/1997 | Jung et al. .................. | 327/541 |
| 6,018,235 A | * | 1/2000 | Mikuni ........................ | 323/313 |
| 6,111,457 A | * | 8/2000 | Lim et al. .................... | 327/541 |
| 6,677,808 B1 | * | 1/2004 | Sean et al. ................... | 327/539 |
| 6,784,652 B1 | * | 8/2004 | Aude .......................... | 323/316 |
| 6,815,941 B2 | * | 11/2004 | Butler ......................... | 323/313 |
| 6,992,472 B2 | * | 1/2006 | Schimper .................... | 323/313 |

(Continued)

FOREIGN PATENT DOCUMENTS

JP    5-204480 A    8/1993

(Continued)

OTHER PUBLICATIONS

International Search Report of PCT/JP2005/018014, date of mailing Nov. 8, 2005.

*Primary Examiner*—Lincoln Donovan
*Assistant Examiner*—Thomas J Hiltunen
(74) *Attorney, Agent, or Firm*—Westerman, Hattori, Daniels & Adrian, LLP.

(57) ABSTRACT

A constant voltage generating circuit according to the present invention includes a reference voltage generation source 1, a differential amplifier 2 that receives an output voltage (REF1) of the reference voltage generation source 1 at one terminal and receives a potential (VREF2), generated by adding a predetermined potential difference to a regulator voltage (VREG), at another terminal, and switching means 6 that controls the current amount of an output terminal 10 of the reference voltage generation source 1 so that the current amount increases for a fixed period of time immediately after the power is turned on. The switching means 6, which is turned on/off based on VREF2, stabilizes the output voltage (REF1) of the reference voltage generation source 1 quickly after the power is turned on and then stabilizes the regulator voltage (VREG).

7 Claims, 14 Drawing Sheets

U.S. PATENT DOCUMENTS

| | | | |
|---|---|---|---|
| 7,288,926 B2 * | 10/2007 | Lee et al. | 323/314 |
| 7,298,200 B2 * | 11/2007 | Won | 327/541 |
| 7,321,256 B1 * | 1/2008 | Vasudevan | 327/539 |
| 7,348,834 B2 * | 3/2008 | Itoh | 327/539 |
| 2003/0001554 A1 * | 1/2003 | Park | 323/315 |
| 2005/0231270 A1 * | 10/2005 | Washburn | 327/539 |

FOREIGN PATENT DOCUMENTS

| | | |
|---|---|---|
| JP | 7-250437 A | 9/1995 |
| JP | 9-265329 A | 10/1997 |
| JP | 2594470 Y2 | 4/1999 |
| JP | 2000-75947 A | 3/2000 |
| JP | 3149992 B2 | 1/2001 |
| JP | 2002-132359 A | 5/2002 |

\* cited by examiner

CONSTANT VOLTAGE GENERATING CIRCUIT

TECHNICAL FIELD

The present invention relates to a constant voltage generating circuit, and more particularly to a constant voltage generating circuit that generates a predetermined reference voltage based on the power supply voltage and outputs a regulated voltage based on the reference voltage.

BACKGROUND ART

In a system such as a watch IC where small current-consumption characteristics, that is, low power characteristics, are required, a constant voltage generating circuit (regulator) is conventionally used as the power supply for an internal circuit. The constant voltage generating circuit lowers an externally-supplied power supply voltage and generates a regulated voltage. An internal circuit, such as a watch IC, is driven by this regulated voltage. Such a constant voltage generating circuit is also used as an analog-basis bias power supply.

FIG. 8 is a circuit diagram showing the configuration of a typical constant voltage generating circuit. As shown in FIG. 8, the constant voltage generating circuit generates the reference voltage by a reference voltage generation source 1 based on the power supply voltage, amplifies the current by a differential amplifier 2, and performs fine adjustment and feedback control by an output stage 3 to generate a desired output voltage. The power supply voltage is given by the potential difference between a positive power supply potential VDD and a negative power supply potential VSS. The potential of the positive power supply potential VDD is given to a positive power supply line 5, and the potential of the negative power supply potential VSS is given to a negative power supply line 4. In general, the negative power supply is used for a watch IC with the positive power supply potential VDD as the ground potential.

The reference voltage generation source 1 can comprise, for example, two P-channel MOS transistors (hereinafter called PMOS transistors) 11 and 12 and two N-channel MOS transistors (hereinafter called NMOS transistors) 13 and 14, each of which configure a current mirror circuit, and a resistor 15.

The source of the first PMOS transistor 11 is connected to one end of the resistor 15. The other end of the resistor 15 is connected to the positive power supply line 5. The gate of the first PMOS transistor 11 is connected to the gate and the drain of the second PMOS transistor 12 and to the drain of the second NMOS transistor 14.

The drain of the first PMOS transistor 11 is connected to the drain and the gate of the first NMOS transistor 13 and to the gate of the second NMOS transistor 14. The source of the second PMOS transistor 12 is connected to the positive power supply line 5. The source of the first NMOS transistor 13 and the source of the second NMOS transistor 14 are connected to the negative power supply line 4. A connection node 16 between the drain of the second PMOS transistor 12 and the drain of the second NMOS transistor 14 is the output terminal of the reference voltage generation source 1 from which a first potential REF1 is output as the reference voltage.

A node 16, which is the output terminal of the reference voltage generation source 1, is connected to one of the input terminals of the differential amplifier 2 and to an output stage 3. The other input terminal and the output terminal of the differential amplifier 2 are connected to the output stage 3.

The output stage 3 comprises a phase compensating capacitor 31, a third NMOS transistor 32 for output driving, a fourth NMOS transistor 33 that adds a predetermined potential difference (in this case, the positive threshold Vth of the NMOS transistor) to the potential of a regulated voltage output terminal 30 (regulated voltage VREG), and a third PMOS transistor 34 that is the constant current source.

The output terminal of the differential amplifier 2 is connected, via the phase compensating capacitor 31, to the regulated voltage output terminal 30, to the drain of the third NMOS transistor 32, and to the source and the bulk of the fourth NMOS transistor 33. The output terminal of the differential amplifier 2 is connected also to the gate of the third NMOS transistor 32. The source of the third NMOS transistor 32 is connected to the negative power supply line 4. The drain and the gate of the fourth NMOS transistor 33 are connected to the other input terminal of the differential amplifier 2 and to the drain of the third PMOS transistor 34. That is, a second potential REF2, which is output from the drain of the fourth NMOS transistor 33, is applied to the other input terminal of the differential amplifier 2.

The gate of the third PMOS transistor 34 is connected to the node 16 that is the output terminal of the reference voltage generation source 1. That is, the first potential REF1 is applied to the gate of the third PMOS transistor 34. The source of the third PMOS transistor 34 is connected to the positive power supply line 5.

The configuration described above causes the differential amplifier 2 to operate so that the potential of the regulated voltage output terminal 30 is set to the potential generated by adding the positive threshold Vth of the fourth NMOS transistor 33 to the first potential REF1. This operation is the regulator operation.

FIG. 9 shows the potential changes in the parts when the constant voltage generating circuit shown in FIG. 8 described above is started. When the power is turned on and the potential of the negative power supply line 4 becomes the negative power supply potential VSS as shown in FIG. 9(a), the first potential REF1 changes gradually from the positive power supply potential VDD to the negative power supply potential VSS side and, after the period T1 is elapsed from the power-on time, becomes stable at a constant potential as shown in FIG. 9(b). The second potential REF2 once drops to the negative power supply potential VSS side and, after that, becomes stable at the same potential as that of the first potential REF1 as shown in FIG. 9(c). When the first potential REF1 and the second potential REF2 become stable at the same potential, the regulated voltage VREG becomes a stable potential as shown in FIG. 9(d).

A constant voltage generating circuit, especially, a constant voltage generating circuit for generating a driving voltage for driving a watch IC, is required that the current consumption is low as described above, that the startability from the time the power is turned on to the time the potential becomes stable is good, and that the output potential is stable against power supply voltage variations.

The following describes the startability required for the constant voltage generating circuit described above. The detailed transitional operation performed until the potential of the regulated voltage VREG becomes stable is as follows. Immediately after the power is turned on, the gate-bulk capacitor C between the phase compensating capacitor 31 and the third NMOS transistor 32 is not charged. Therefore, the potential of the regulated voltage VREG is almost equal to the negative power supply potential VSS (FIG. 9(d)). In addition, immediately after the power is turned on, the gate bias (first potential REF1) of the third PMOS transistor 34 is low.

Therefore, the current supply capacity of the third PMOS transistor 34 is too low to quickly charge the gate-bulk capacitor C between the phase compensating capacitor 31 and the third NMOS transistor 32.

Therefore, there is a period T1 required until the regulated voltage VREG becomes almost equal to the power supply voltage. When the output potential (first potential REF1) of the reference voltage generation source 1 becomes stable and the third PMOS transistor 34 can supply a predetermined current, the gate-bulk capacitor C between the phase compensating capacitor 31 and the third NMOS transistor 32 is charged. This makes the potential of the regulated voltage VREG equal to a desired potential.

As described above, the startability of the constant voltage generating circuit having the configuration shown in FIG. 8 depends on the startability of the reference voltage generation source 1. Especially, for a watch IC that requires small current-consumption characteristics, the operating current is small and the time (period T1) to the convergence of the stable operating point gets longer because the reference voltage generation source 1 comprises the high-resistance resistor 15 and high-impedance (long channel length L) MOS transistors 11, 12, 13, and 14.

This period T1, which varies according to the threshold Vth of the MOS transistors 11, 12, 13, and 14, the ambient temperature, and the applied negative power supply potential VSS, takes about a few milliseconds at room temperature and, takes a few seconds to tens of seconds at low temperature. Therefore, when the constant voltage generating circuit shown in FIG. 8 is used as the power supply of an internal circuit, the problem is that the current consumption at start time increases because the regulated voltage VREG is almost equal to the power supply voltage. When this constant voltage generating circuit is used as an analog-based bias power supply, the problem is that a malfunction may occur because an appropriate bias voltage cannot be supplied at least for the period T1.

Those startability problems can be solved by temporarily increasing the current that flows in the reference voltage generation source 1 immediately after the power is turned on to accelerate the convergence to the stable operating point. The applicant already proposed an invention for improving the startability of the reference voltage generation source 1 (for example, see Patent Document 1). In this invention, a capacitor 17 is connected between the output node 16, which is the output terminal of the reference voltage generation source 1, and the negative power supply line 4 as shown in FIG. 10. The capacitor 17 is not charged when the power is turned on. Therefore, the output node 16 is forced to be lowered to the negative power supply potential VSS. This causes a large current to flow temporarily in the reference voltage generation source 1 to converge the potential quickly to the stable operating point.

However, a later study indicates that the invention described above has a problem with the output potential stability against power supply voltage variations, which is another requirement for the constant voltage generating circuit described above, and, as a result, does not give full stability in some cases.

For example, when a system is driven using a power supply stored in the secondary battery by a power generation device, for example, when a solar watch is driven by a solar battery system, the power supply voltage varies according to the power generation amount. If the invention is applied to such a system to accelerate the convergence to the stable operating point using a capacitor as described above, the capacitor added to improve the startability causes the output potential to vary according to the power supply variation.

For example, when the negative power supply potential VSS varies as shown in FIG. 11, the potential variation of the power supply is superimposed directly on the output potential because the charged voltage of the capacitor 17 is retained and, as a result, the potential of the output node 16 of the reference voltage generation source 1 varies according to the power supply variation. Therefore, the output potential stability against the power supply variation is low. On the other hand, the capacity of the capacitor 17, if decreased, can weaken the effect of the power supply variation, in which case, however, the system does not achieve the full effect of startability improvement.

On the other hand, Japanese Patent Laid-Open Publication No. Sho 62-296213 proposes a method for improving the output potential stability against power supply voltage variations. The constant voltage circuit disclosed in this document comprises a current mirror circuit and a first constant voltage device wherein the non-reference potential side terminal of the first constant voltage device is an output terminal, and the constant voltage circuit further comprises a series circuit, composed of a starting resistor and a second constant voltage device, and a switching device connected between the terminals on the non-reference potential side of the first and second constant voltage devices.

In this configuration, the switching device is conducted immediately after the start to flow the starting current and start the constant voltage circuit and, after the conduction, the switching device is turned off. In the first on state, this switching device supplies the starting current to the first constant voltage device as a bias to initially start the constant voltage circuit and, in the second off state, stops the supply of the starting current to prevent the effect of the power supply voltage variations.

In addition to the configuration described above, a constant voltage circuit is also proposed in which the gate potential of a transistor, which constitutes the current mirror circuit in the constant voltage generating circuit, is controlled to increase the operating current so that the output potential not dependent on the power supply voltage variations is provided and, at the same time, a stable potential is obtained shortly after the power is turned on (for example, see Patent Documents 2-5).

Patent Document 1: Registered utility model 2594470

Patent Document 2: Japanese Patent Laid-Open Publication No. 2002-132359

Patent Document 3: Japanese Patent No. 3149992

Patent Document 4: Japanese Patent Laid-Open Publication No. Hei 09-265329

Patent Document 5: Japanese Patent Laid-Open Publication No. Hei 05-204480

This constant voltage generating circuit comprises, for example, a reference voltage generation source that generates a reference voltage for generating a regulated voltage based on the power supply voltage and gate control means that controls the gate potential of a transistor constituting the current mirror circuit so that the amount of current, which flows in the current mirror circuit included in the reference voltage generation source, increases for a fixed period immediately after the power is turned on.

The gate control means controls the gate potential of the transistor. Turning on the gate increases the operating current of the current mirror circuit and produces a stable potential shortly after the power supply is turned on. Turning off the gate prevents output potential variations caused by power supply voltage variations.

FIG. 12 is a circuit diagram showing the configuration of a constant voltage generating circuit that controls the gate potential of the current mirror circuit. The circuit shown in FIG. 12 is an example based on the configuration shown in FIG. 8 described above. This circuit configuration comprises the constant voltage generating circuit shown in FIG. 8 and further comprises switching means 71 and switching control means 72 that performs the on/off control of the switching means 71.

The switching means 71 is connected between the output node 16 and the negative power supply line 4, wherein the gates of the first and second PMOS transistors 11 and 12, which configure the current mirror circuit of the reference voltage generation source 1, are connected to the output node 16 that is the output terminal of the reference voltage generation source 1.

The switching control means 72 outputs the control signal that instantaneously closes (on) the switching means 71 immediately after the power is turned on. This causes the switching means 71 to be closed for a fixed period of time immediately after the power is turned on and, after that, to be opened (off). The switching means 71 is configured, for example, by a MOS transistor.

For a fixed period of time immediately after the power is turned on, the gate potential of the first PMOS transistor 11 and the gate potential of the second PMOS transistor 12 are controlled by the switching means 71 and the switching control means 72. Therefore, the switching means 71 and the switching control means 72 have the function equivalent to the gate control means. In addition, because the switching means 71 and the switching control means 72 connect the output node 16, which is the output terminal of the reference voltage generation source 1, to the negative power supply line 4, they have the function equivalent to the base voltage control means for a fixed period of time after the power is turned on.

FIG. 13 is a circuit diagram of the switching control means 72 that comprises a resistor 73, a capacitor 74, and an inverter 75. The resistor 73 and the capacitor 74 are connected in series between the positive power supply potential VDD and the negative power supply potential VSS. The input terminal of the inverter 75 is connected to a connection node 76 between the resistor 73 and the capacitor 74. The control signal, which controls the opening/closing of the switching means 71, is output from an output terminal 77 of the inverter 75.

FIG. 14 is a waveform diagram showing the potential change when the switching control means 72 shown in FIG. 13 is started. As shown in FIG. 14(b), the potential of the connection node 76 becomes the negative power supply potential VSS at the same time the power is turned on and the potential of the negative power supply line 4 becomes the negative power supply potential VSS (FIG. 14(a)). After that, the potential of the connection node 76 is gradually changed to the positive power supply potential VDD side as the capacitor 74 is charged.

As shown in FIG. 14(c), the potential of the output terminal 77 of the inverter 75 remains at the positive power supply potential VDD after the power is turned on and before the potential of the connection node 76 reaches ½ of the power supply voltage (VSS/2), and becomes the negative power supply potential VSS when the potential of the connection node 76 becomes higher than ½ of the power supply voltage (VSS/2) and enters the positive power supply potential VDD side. The switching means 71 is in the closed state during the period T2 from the time the power is turned on to the time the potential of the output terminal 77 of the inverter 75 is inverted from the positive power supply potential VDD to the negative power supply potential VSS.

However, the problem with the constant voltage circuit described above is that the switching control means 72 must be provided separately, because the circuit has a configuration in which the on/off state of the switching means 71 is controlled by means of the switching control means 72. The period of the closed state generated by this switching control means 72 immediately after the power is turned on is determined based on the charging time of the capacitor 74. Therefore, to reduce this period T2, the time constant can be reduced by decreasing the resistance of the resistor 73 or decreasing the capacitance of the capacitor 74. However, in this configuration where a large current flows in the switching control means 72 in a short period of time, there is a problem that the current resistance characteristics of the devices configuring the switching control means 72, as well as the noises generated in the switch current, must be taken into consideration.

DISCLOSURE OF THE INVENTION

The present invention solves the problems with the prior art described above. It is an object of the present invention to provide a constant voltage generating circuit that provides an output potential that is stable against power supply voltage variations without being affected by power supply variations, provides good startability from the time the power is turned on to the time the potential becomes stable, and outputs a stable regulated voltage shortly after the power is turned on.

It is another object of the present invention to provide a simple circuit configuration, which eliminates the need for an additional circuit such as the switching control means, to gain output potential stability against the power supply voltage variations described above and to ensure good startability from the time the power is turned on to the time the potential becomes stable.

It is still another object of the present invention to provide a circuit configuration that can produce a stable regulated voltage shortly after the power is turned on without worrying about the noises and the current resistance characteristics.

The present invention provides the following modes to solve the problems described above and to archive the objects. FIG. 1 is a general circuit diagram showing the general configuration of a constant voltage generating circuit of the present invention.

Referring to FIG. 1, the constant voltage generating circuit outputs a regulator voltage (VREG) obtained by lowering the power supply voltage (VSS). Note that the one of the power supply voltages is the ground voltage (VDD).

The constant voltage generating circuit according to the present invention comprises a reference voltage generation source 1 that generates a reference voltage used for generating the regulator voltage (VREG) based on the power supply voltage (VSS); and a differential amplifier 2 that receives an output potential (REF1) of the reference voltage generation source 1 via one input terminal and receives a potential (REF2), generated by adding a predetermined potential difference ($\Delta v$) to a voltage (VREG) of a regulator voltage output terminal via another input terminal to keep a potential of the regulator voltage output terminal at a constant potential based on the potentials (REF1, REF2) received at the two input terminals.

The constant voltage generating circuit further comprises switching means 6 that controls the output potential so that an amount of a current at an output terminal 10 of the reference voltage generation source 1 increases for a fixed period of time immediately after the power is turned on. The switching means 6 includes a transistor whose on state and off state switching is controlled, and the switching of this transistor between the on state and the off state is controlled based on the potential (REF2) received at the other input terminal of the differential amplifier.

Turning on the switching means 6 changes the potential of the output terminal 10 of the reference voltage generation source 1, increases the amount of current from the output terminal 10 of the reference voltage generation source 1 to the differential amplifier 2 side and, thereby, stabilizes the output voltage of the reference voltage generation source shortly after the power is turned on and stabilizes the regulator voltage. Turning off the switching means 6 can prevent output potential variations caused by power supply voltage variations.

This switching means 6, controlled based on the potential (REF2) received at the other input terminal of the differential amplifier 2, eliminates the need for separately providing switching control means for controlling the switching means 6 and makes it possible to create the circuit in a simple configuration. The switching means of the present invention can control the output potential of the reference voltage generation source in one of multiple modes.

In a first embodiment and a second embodiment of the present invention, the output terminal of the reference voltage generation source is connected to the other input terminal of the differential amplifier for a fixed period of time immediately after the power is turned on.

In the first and second embodiments, turning on the switching means for a fixed period of time immediately after the power is turned on lowers the potential (REF1) received at one input terminal of the differential amplifier to the potential (REF2) received at the other input terminal. This increases the amount of current flowing in the reference voltage generation source, quickly stabilizes the output voltage of the reference voltage generation source, and stabilizes the regulator voltage.

Turning off the switching means 6 prevents a through current and prevents output potential variations caused by power supply voltage variations.

In a third embodiment of switching means of the present invention, the output terminal of the reference voltage generation source is connected to the negative power supply line for a fixed period of time immediately after the power is turned on.

In the third embodiment, turning on the switching means for a fixed period of time immediately after the power is turned on lowers the potential (REF1) received at one input terminal of the differential amplifier to the negative power supply voltage (VSS). This increases the amount of current flowing in the reference voltage generation source, quickly stabilizes the output voltage of the reference voltage generation source, and stabilizes the regulator voltage.

In a fourth embodiment of switching means of the present invention, the output terminal of the reference voltage generation source is connected to the regulator voltage output terminal for a fixed period of time immediately after the power is turned on.

In the fourth embodiment, turning on the switching means for a fixed period of time immediately after the power is turned on lowers the potential (REF1) received at one input terminal of the differential amplifier to the voltage (VREG) of the regulator voltage output terminal. This increases the amount of current flowing in the reference voltage generation source, quickly stabilizes the output voltage of the reference voltage generation source, and stabilizes the regulator voltage.

Because the voltage (VREG) of the regulator voltage output terminal is closer to the positive power supply potential VDD than to the negative power supply potential VSS, the leak current in the stable state when the switching means is turned off can be lowered.

The switching means of the present invention can comprise an N channel or P channel transistor whose on state and off state switching is controlled based on the potential received at the other input terminal of the differential amplifier.

The reference voltage generation source can have one of various configurations, for example, a configuration in which a current mirror circuit is included or a configuration in which a series circuit composed of a resistor and a diode is included.

The reference voltage generation source that includes a current mirror circuit controls, via the switching means, the gate potentials of the transistors, which constitute the current mirror circuit, for a fixed period of time immediately after the power is turned on to increase the amount of current flowing in the current mirror circuit, thus quickly stabilizing the output potential of the reference voltage generation source.

The reference voltage generation source that includes a series circuit, composed of a constant voltage diode and a resistor, controls the potential of the connection point between the constant voltage diode and the resistor, which constitute the series circuit, for a fixed period of time via the switching means immediately after the power is turned on to increase the amount of current flowing in the series circuit, thus quickly stabilizing the output potential of the reference voltage generation source. This is a fifth embodiment.

BEST MODE FOR CARRYING OUT THE INVENTION

Preferred embodiments of a constant voltage generating circuit of the present invention will be described below in detail with reference to the attached drawings. Although the present invention is applied to the typical constant voltage generating circuit shown in FIG. 8 described above, the present invention is applicable not only to this constant voltage generating circuit but also to a constant voltage generating circuit having another configuration.

Figure 8:
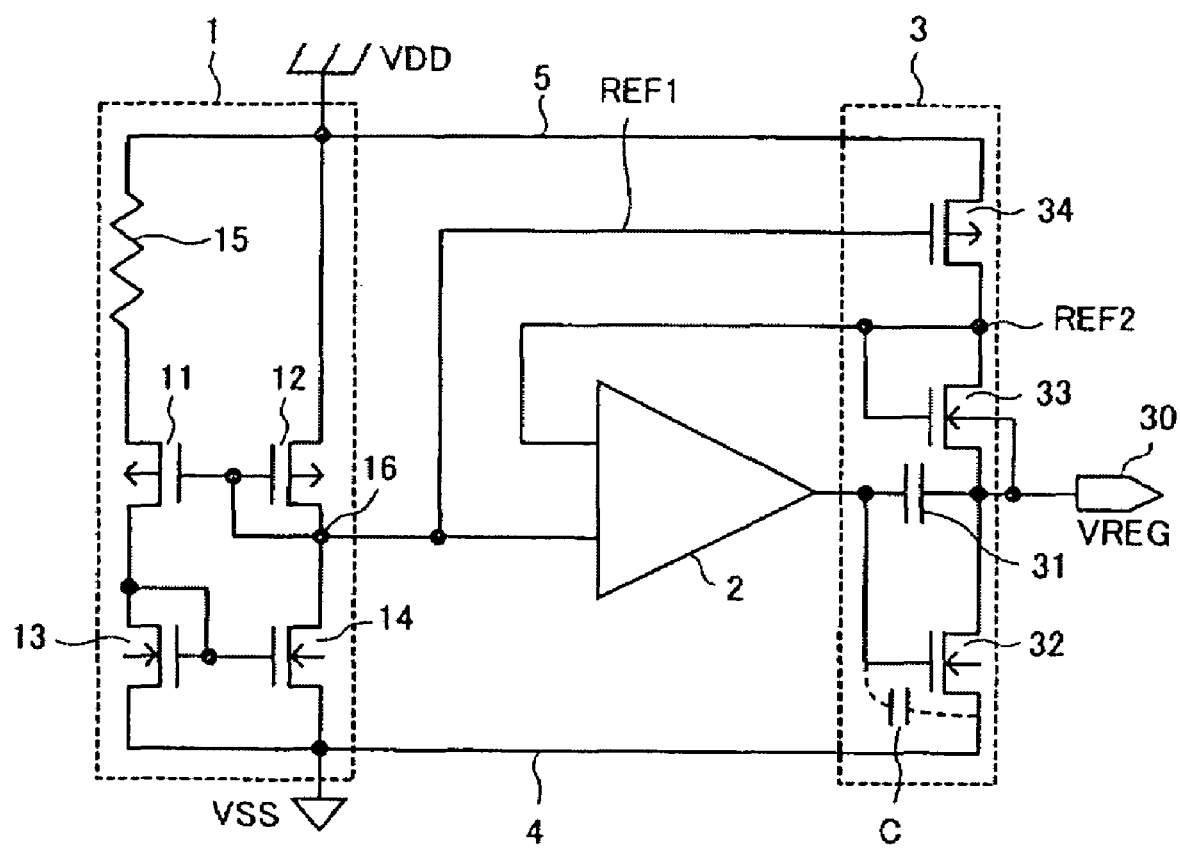
FIG. 8 is a circuit diagram showing the configuration of a typical constant voltage generating circuit.

Therefore, in the embodiments below, the same numeral is given to the same configuration as that shown in FIG. 8 described above, and its description is omitted.

Figure 1:
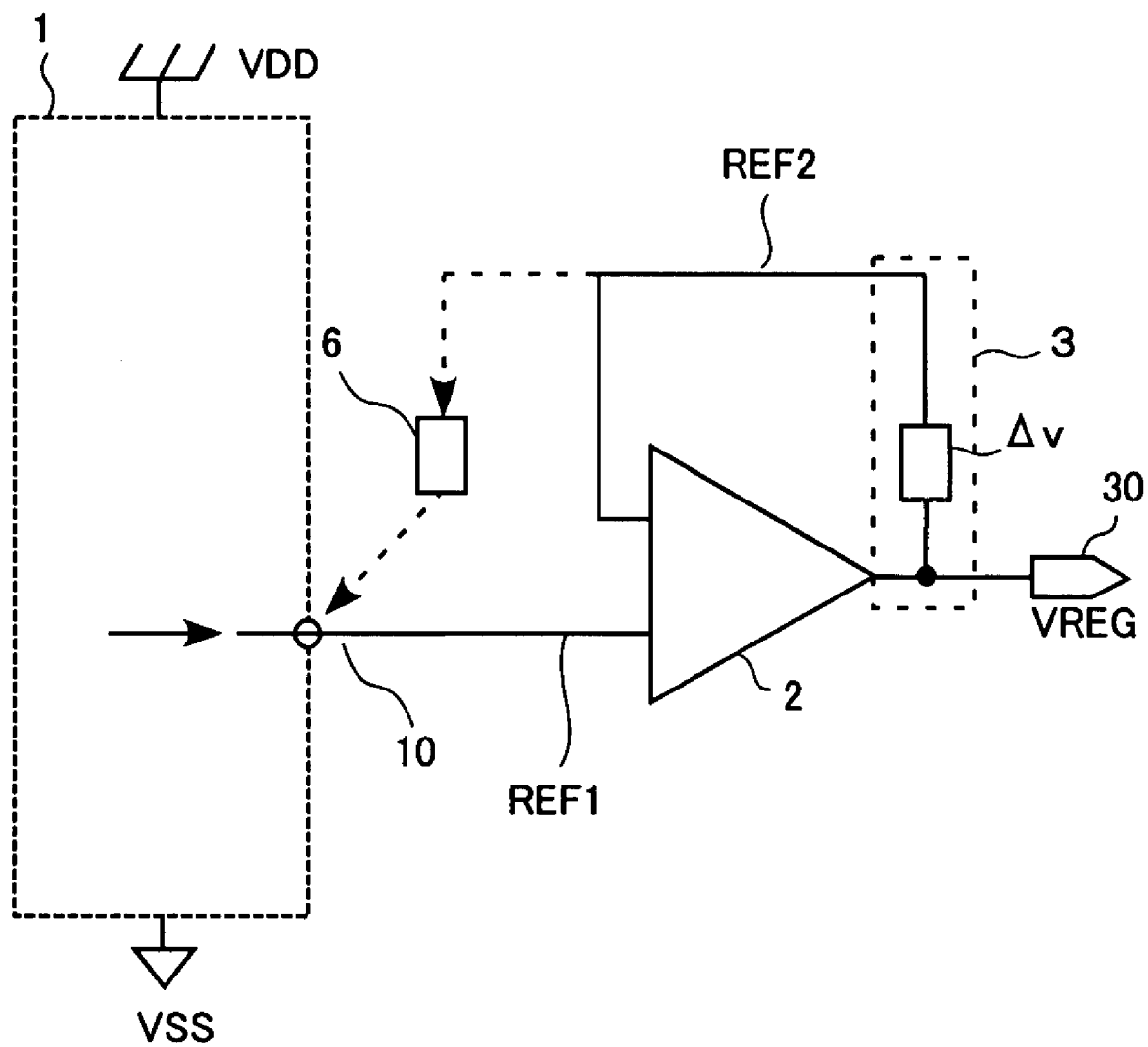
FIG. 1 is a circuit diagram showing the general configuration of a constant voltage generating circuit of the present invention.

The embodiments of the present invention given below have the configuration in which switching means is provided for controlling the switching between the on state and the off state based on the potential (REF2) received at another input terminal of the differential amplifier as shown in FIG. 1. The open/close operation of this switching means controls the output potential so that the current amount at the output terminal of the reference voltage generation source is increased for a fixed period of time immediately after the power is turned on.

In the embodiments given below, the open/close operation of the switching means is performed to connect the output terminal of the reference voltage generation source to a low potential part for a fixed period of time immediately after the power is turned on to increase the current amount at the output terminal of the reference voltage generation source. The output terminal of the voltage generation source is connected to the low potential part by connecting the output terminal to the other input terminal of the differential amplifier in the first and second embodiments and in the fifth embodiment, by connecting the output terminal to the negative power supply line in the third embodiment, and by connecting the output terminal to the regulator voltage output terminal in the fourth embodiment. The control of this switching means is performed based on the potential received at the other input terminal of the differential amplifier.

First to fourth embodiments are described using an example in which a current mirror circuit is included as the reference voltage generation circuit, and a fifth embodiment is described using an example in which a series circuit composed of a resistor and a constant voltage diode is included as the reference voltage generation circuit.

First Embodiment

Figure 2:
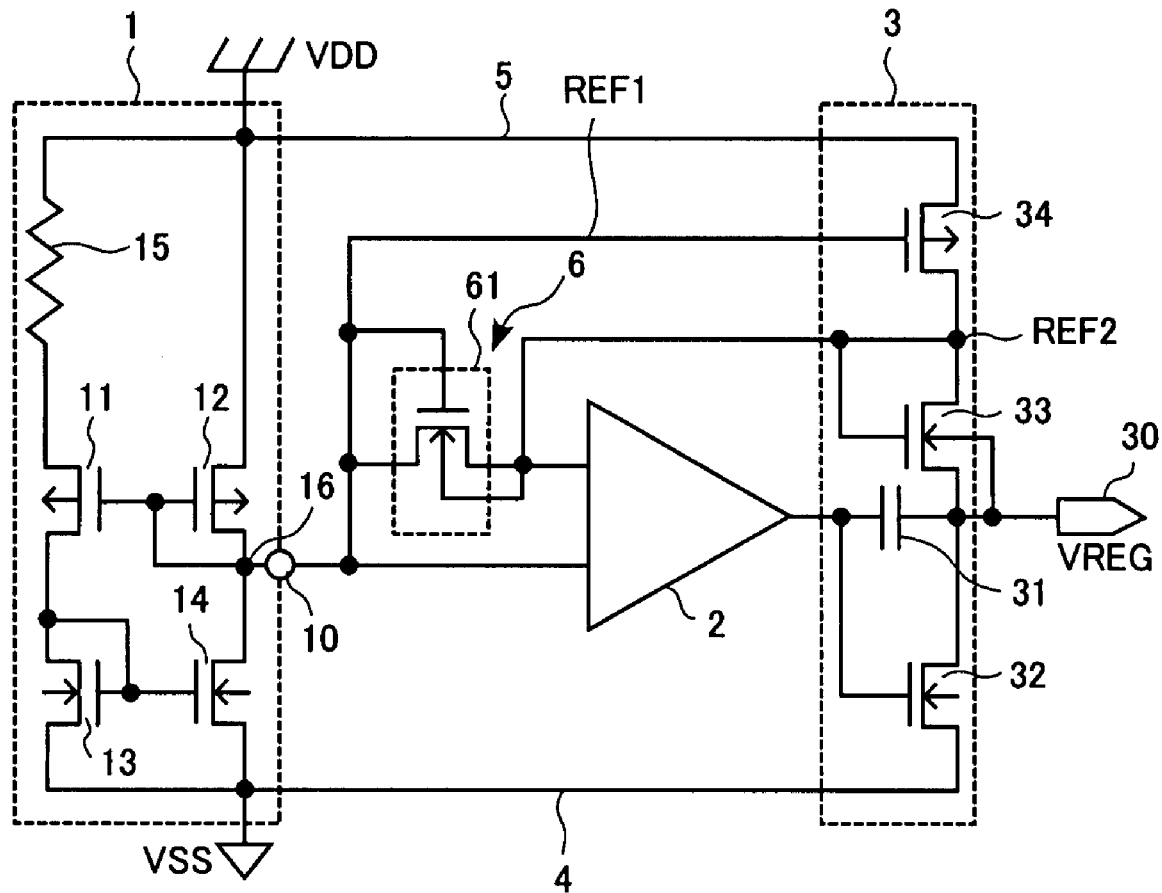
FIG. 2 is a circuit diagram showing a constant voltage generating circuit in a first embodiment of the present invention.

FIG. 2 is a circuit diagram showing the configuration of a constant voltage generating circuit in a first embodiment in which the output terminal of a voltage generation source is connected to another input terminal of a differential amplifier for a fixed period of time immediately after the power is turned on.

As shown in FIG. 2, switching means 6 in the first embodiment comprises an NMOS transistor 61, and the switching between the on-state and the off-state of this NMOS transistor 61 is controlled by the signal (potential entered into another input terminal of the differential amplifier) in the constant voltage generating circuit. Because the open/close state of the NMOS transistor 61 is controlled by the potential applied to the transistor, the first embodiment eliminates the need for the switching control means 72 that is included in the conventional configuration.

The gate and the drain of the NMOS transistor 61 are connected to an output node 16 (output terminal 10) of a reference voltage generation source 1. On the other hand, the source and the bulk of the NMOS transistor 61 are connected to the other input terminal of a differential amplifier 2. That is, the first potential REF1 is applied to the gate and the drain of the NMOS transistor 61, and the second potential REF2 is applied to the source and the bulk.

Figure 3:
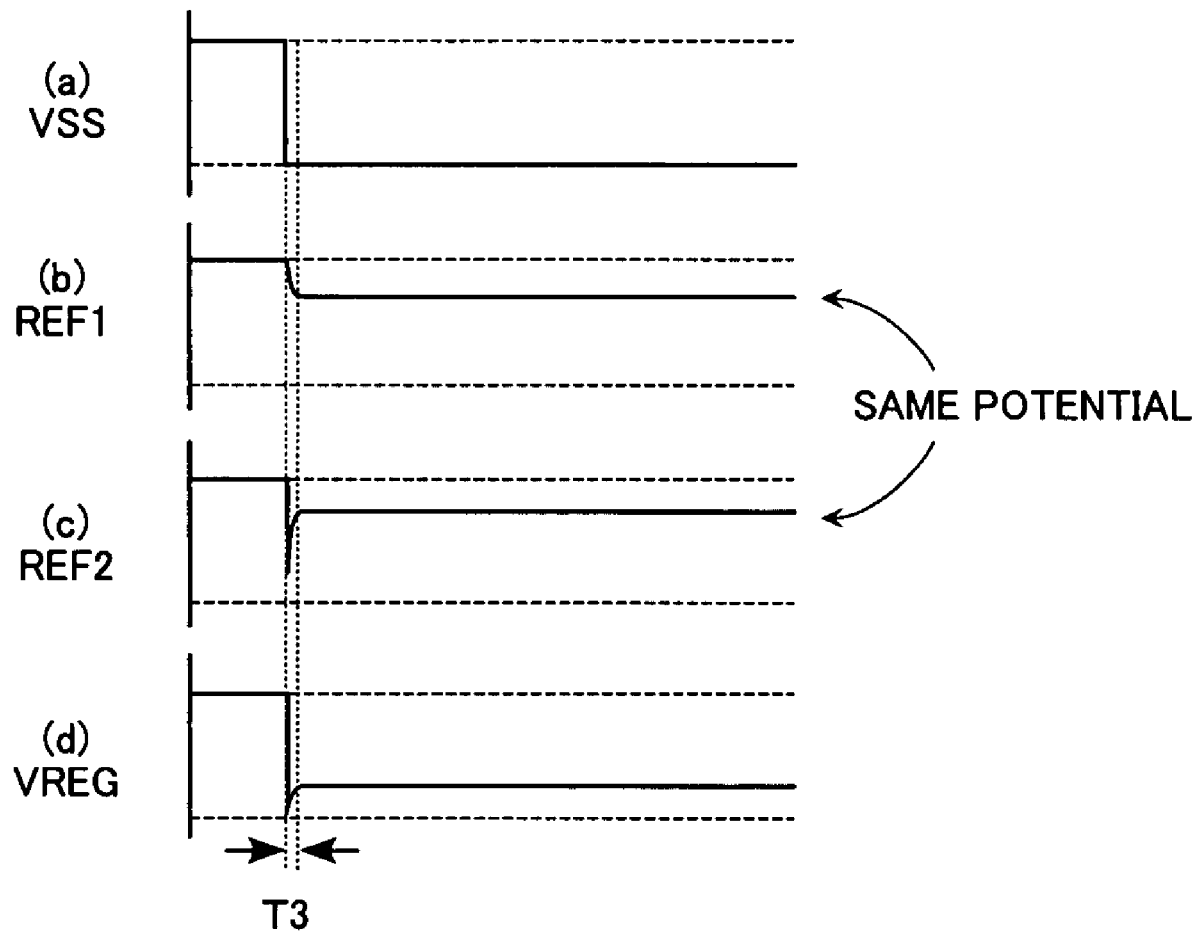
FIG. 3 is a waveform diagram showing the potential changes when the constant voltage generating circuit shown in FIG. 2 is started.

FIG. 3 is a waveform diagram showing the potential changes in the parts when the constant voltage generating circuit shown in FIG. 2 is started. When the power is turned on and the potential of a negative power supply line 4 becomes negative power supply potential VSS as shown in FIG. 3(*a*), there is a potential difference between the first potential REF1 and the second potential REF2 as shown in FIG. 3(*b*) and FIG. 3(*c*). That is, a positive potential with respect to the source is applied to the gate of the NMOS transistor 61. While this potential difference is present, the NMOS transistor 61 is turned on and the first potential REF1 is lowered to the second potential REF2. As a result, the amount of the current flowing in the current mirror circuit increases.

Figure 9:
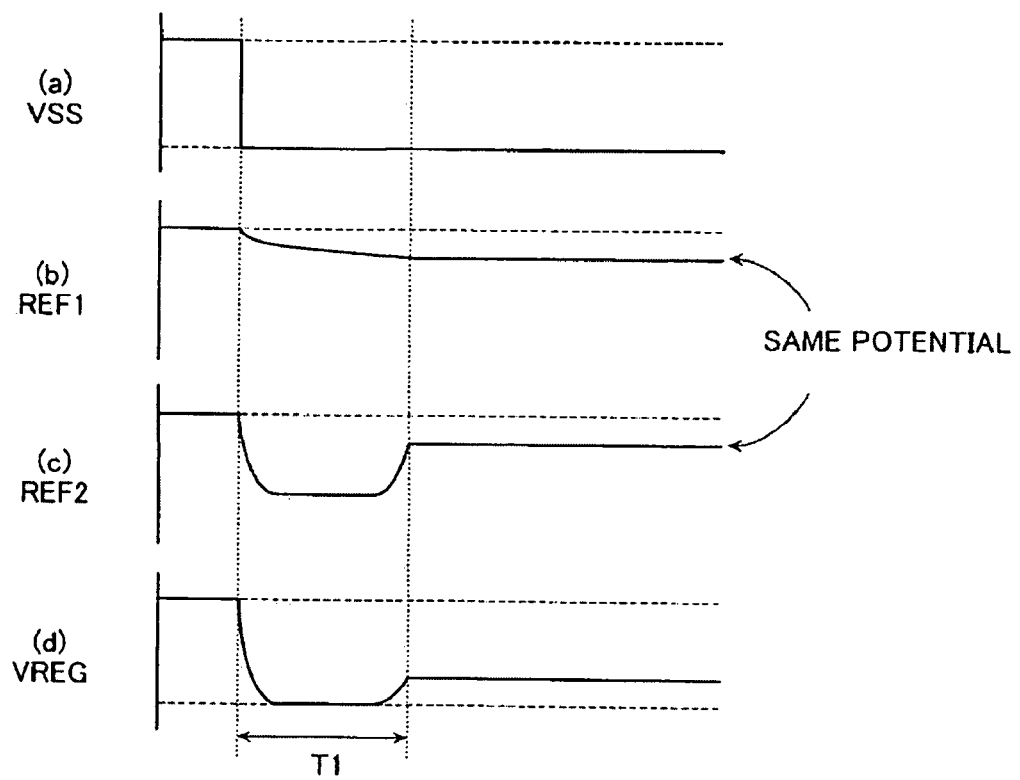
FIG. 9 is a waveform diagram showing the potential changes when the constant voltage generating circuit shown in FIG. 8 is started.
Figure 10:
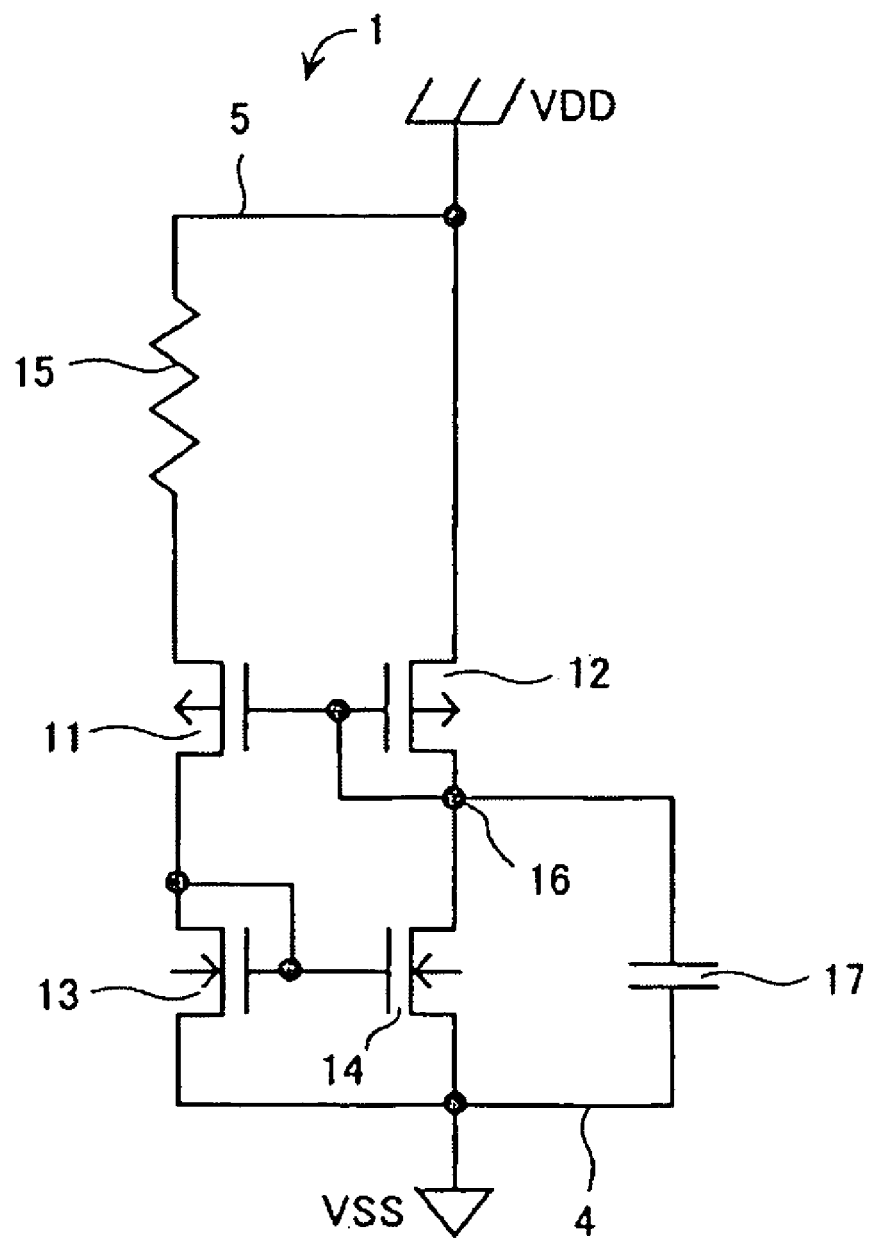
FIG. 10 is a circuit diagram showing the configuration of a reference voltage generation source whose startability is improved from the conventional startability.
Figure 11:
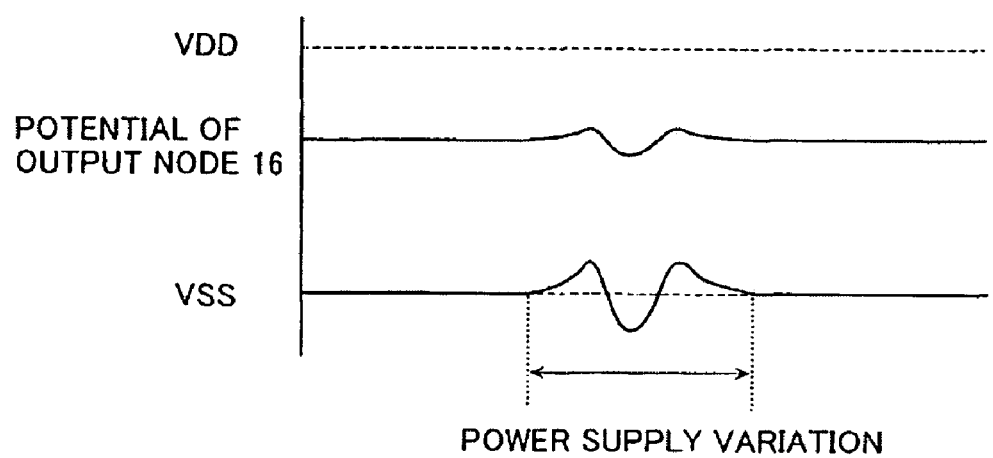
FIG. 11 is a waveform diagram showing the potential changes of the output node of the reference voltage generation source shown in FIG. 10.
Figure 12:
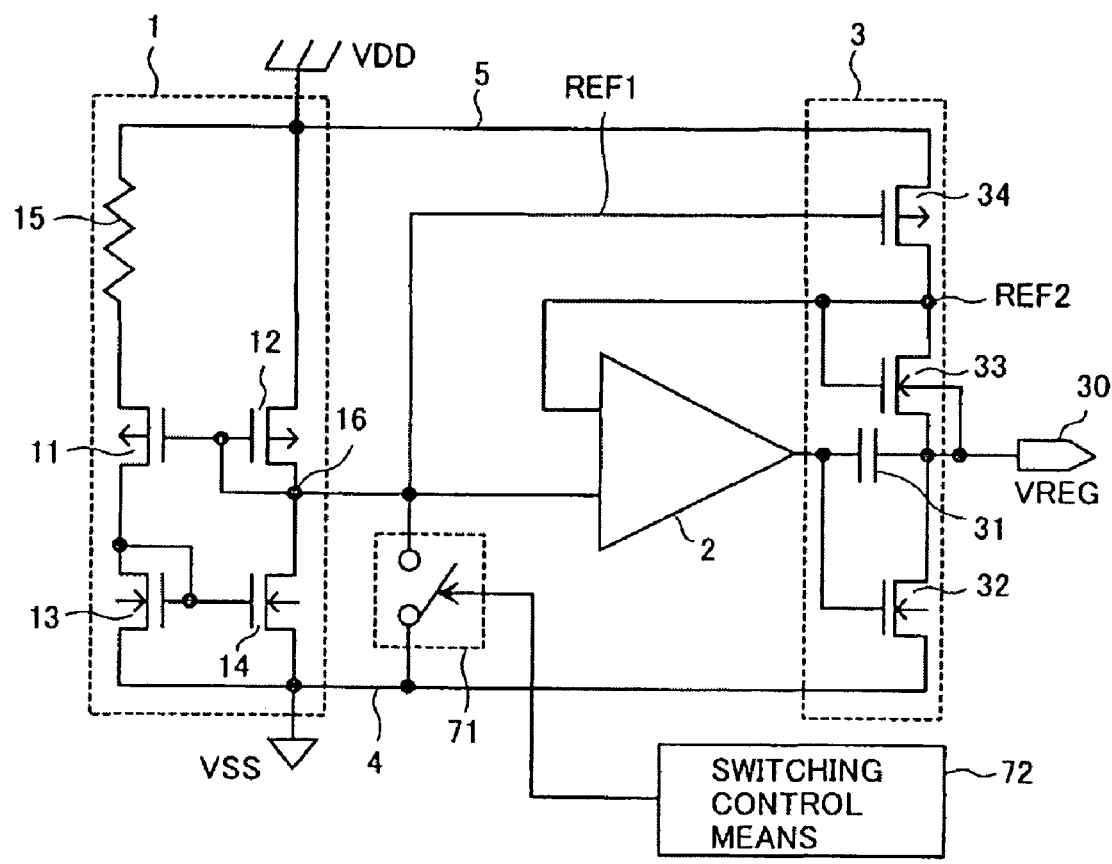
FIG. 12 is a circuit diagram showing the configuration of a constant voltage generating circuit that controls the gate potential of a current mirror circuit.
Figure 13:
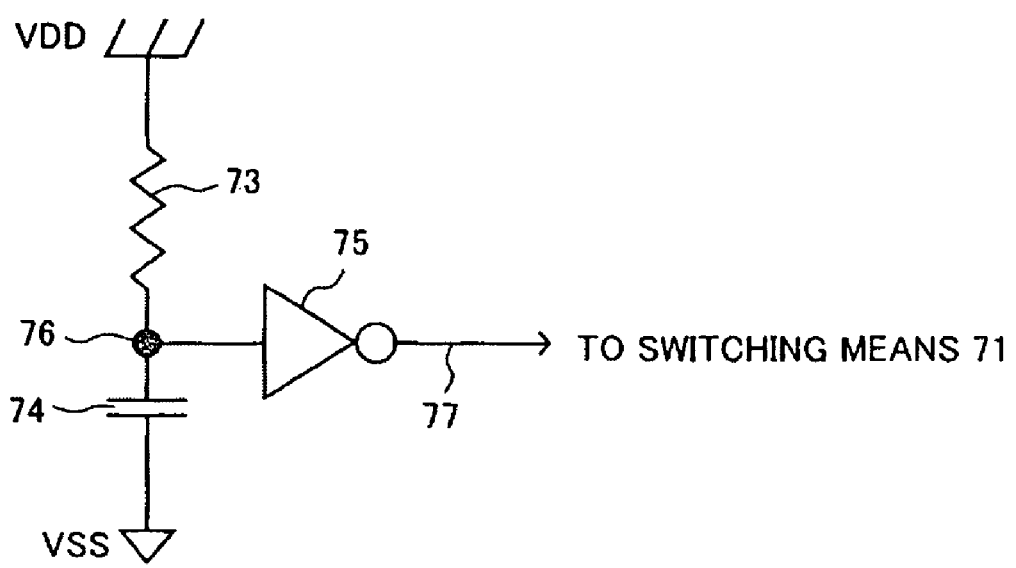
FIG. 13 is a circuit diagram showing an example of switching control means.
Figure 14:
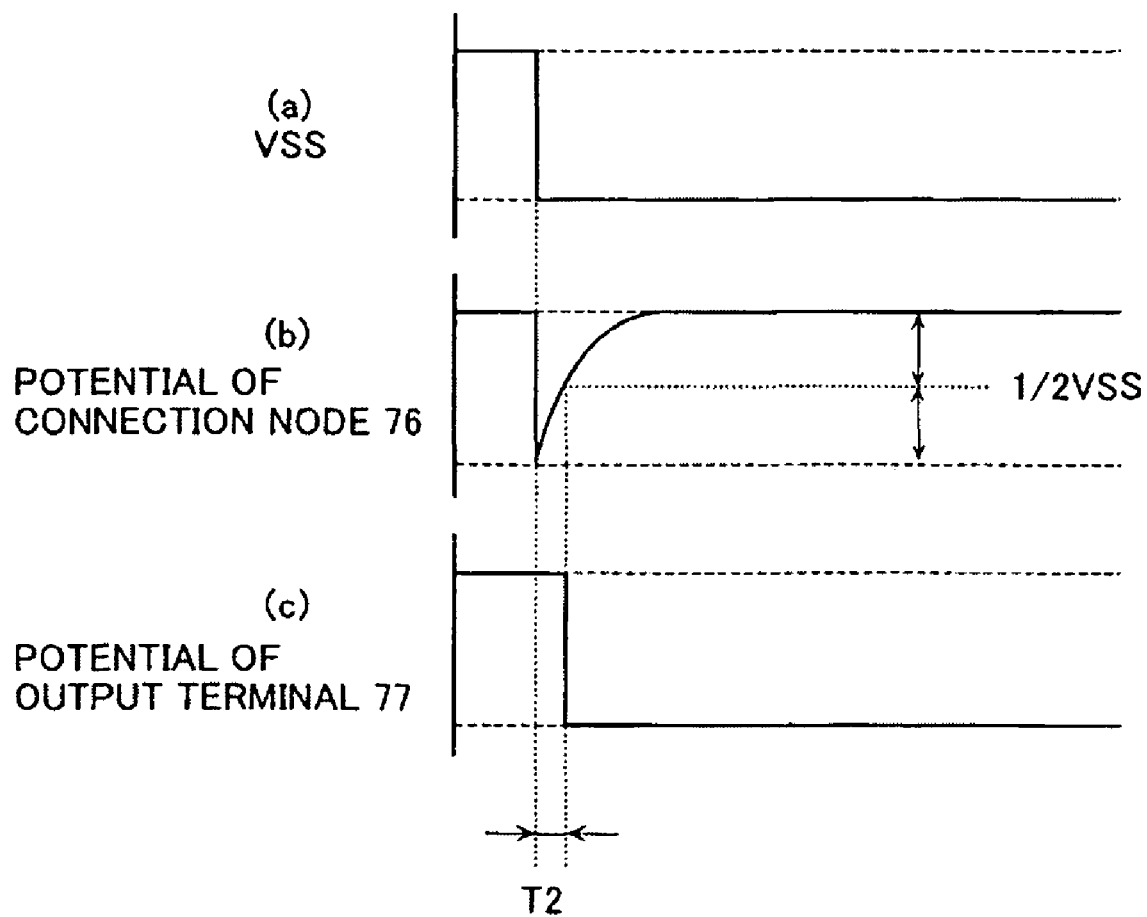
FIG. 14 is a waveform diagram showing the potential changes when the switching control means shown in FIG. 13 is started

After that, when the differential amplifier 2 performs the operation to put the first potential REF1 and the second potential REF2 at the same potential and, as a result, a stable state is created, the regulated voltage VREG is set at a stable potential as shown in FIG. 3(*d*). The time T3 required until this stable state is created is very much shorter than the conventional period T1 (see FIG. 9), for example, about one millisecond at room temperature and 10 milliseconds at low temperature.

When the state becomes stable, the first potential REF1 and the second potential REF2 are at the same potential and, therefore, the NMOS transistor 61 is turned off. Creating the off-state in this way can avoid inconveniences, for example, the off-state can prevent a through current from flowing or prevent the power supply variations from affecting the regulated voltage VREG.

In the first embodiment, the gate potential of a first PMOS transistor 11 and the gate potential of a second PMOS transistor 12 of the current mirror circuit included in the reference voltage generation source 1 are controlled by the NMOS transistor 61 for a fixed period of time immediately after the power is turned on. Therefore, the NMOS transistor 61 has the function of the gate control means of the current mirror circuit.

In addition, the NMOS transistor 61 connects the output node 16 (output terminal 10), which is the output terminal of the reference voltage generation source 1, to the input terminal, which is the terminal via which the second potential REF2 is input to the differential amplifier 2, for a fixed period of time immediately after the power is turned on. Therefore, the NMOS transistor 61 has the function of the reference voltage control means. It is also possible to replace the NMOS transistor 61 with a diode.

Second Embodiment

Figure 4:
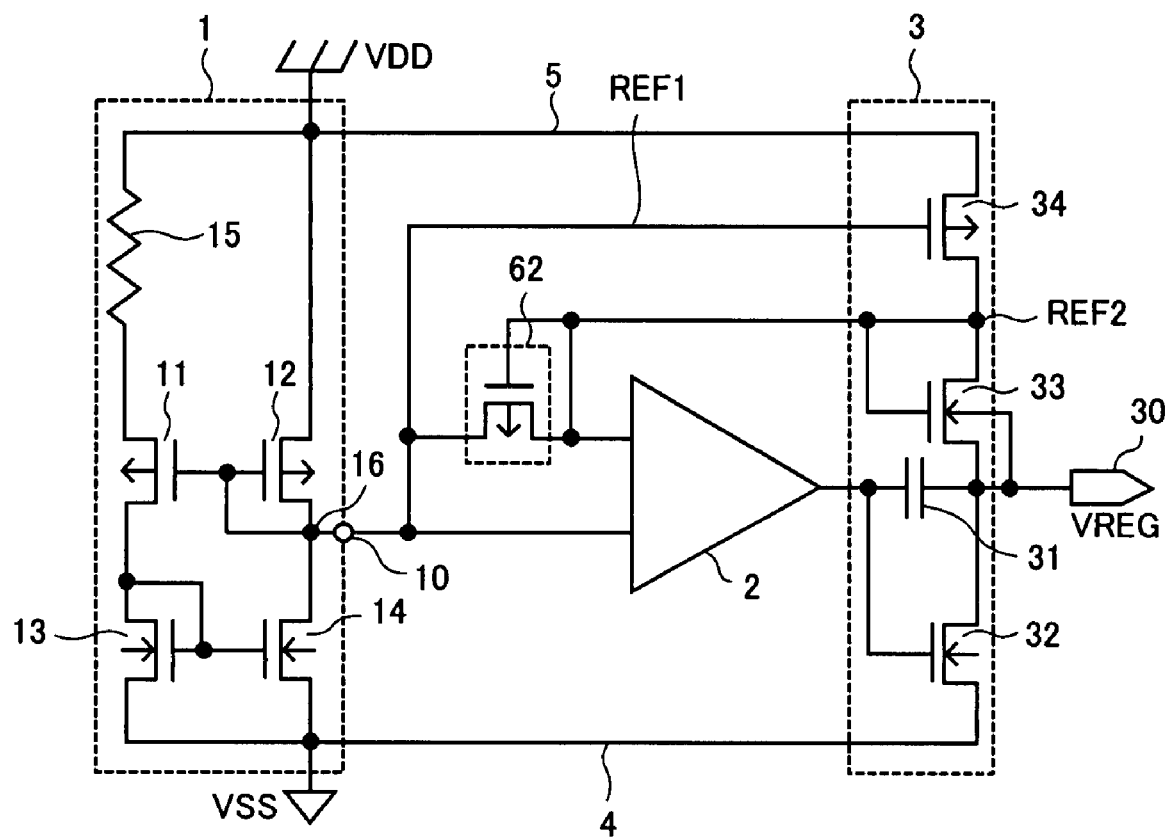
FIG. 4 is a circuit diagram showing a constant voltage generating circuit in a second embodiment of the present invention.

FIG. 4 is a circuit diagram showing the configuration of a constant voltage generating circuit in a second embodiment. As in the first embodiment, the output terminal of the voltage generation source is connected to another input terminal of the differential amplifier for a fixed period of time immediately after the power is turned on.

Switching means 6 in the second embodiment comprises a PMOS transistor 62 as shown in FIG. 4, and the switching between the on-state and the off-state of this PMOS transistor 62 is controlled by the signal (potential input to another input terminal of the differential amplifier) in the constant voltage generating circuit. The switching between the open/close state of the PMOS transistor 62 is controlled by the potential applied to the transistor and, so, the second embodiment also eliminates the need for the switching control means 72 that is required in the conventional configuration.

The source of the PMOS transistor 62 is connected to an output node 16 (output terminal 10) of a reference voltage generation source 1. On the other hand, the gate and the drain of the PMOS transistor 62 are connected to the other input terminal of the differential amplifier 2. The bulk of the PMOS transistor 62 is connected to a positive power supply line 5 or to the output node 16 (output terminal 10) of the reference voltage generation source 1. That is, the first potential REF1 is applied to the source of the PMOS transistor 62, the second potential REF2 is applied to the gate and the drain, and the positive power supply potential VDD or the first potential REF1 is applied to the bulk.

When the power is turned on and the potential of a negative power supply line 4 becomes the negative power supply potential VSS, there is a potential difference between the first potential REF1 and the second potential REF2. That is, a negative potential with respect to the source is applied to the gate of the PMOS transistor 62. While this potential difference is present, the PMOS transistor 62 is turned on and the first potential REF1 is lowered to the second potential REF2. As a result, the amount of the current flowing in the current mirror circuit increases. After that, when the differential amplifier 2 performs the operation to put the first potential REF1 and the second potential REF2 at the same potential, the PMOS transistor 62 is turned off.

When the bulk is connected to a positive power supply line 5 to set the potential to the potential of VDD, the back gate is applied to the PMOS transistor 62 after the start to make this transistor difficult to turn on. Considering that the purpose of the PMOS transistor 62 is to turn on only for a fixed period of time immediately after the power is turned on in order to make a quick start and that, after the start, a voltage variation in the reference power supply is difficult to be transmitted to the first potential REF1, this configuration is convenient because the transistor is difficult to be turned on after the start as described above.

The same is true for PMOS transistors 63 and 64 in third and fourth embodiments that will be described later. The potential change in the parts when the constant voltage generating circuit shown in FIG. 4 is started is similar to that in the first embodiment described above whose waveform diagram is as shown in FIG. 3.

In the second embodiment, the gate potential of a first PMOS transistor 11 and the gate potential of a second PMOS transistor 12 of the current mirror circuit included in the reference voltage generation source 1 are controlled by the PMOS transistor 62 for a fixed period of time immediately after the power is turned on. Therefore, the PMOS transistor 62 has the function of the gate control means.

In addition, the PMOS transistor 62 connects the output node 16 (output terminal 10), which is the output terminal of the reference voltage generation source 1, to the input terminal, which is the terminal via which the second potential REF2 is input to the differential amplifier 2, for a fixed period of time immediately after the power is turned on. Therefore, the PMOS transistor 62 has the function of the reference voltage control means.

Third Embodiment

Figure 5:
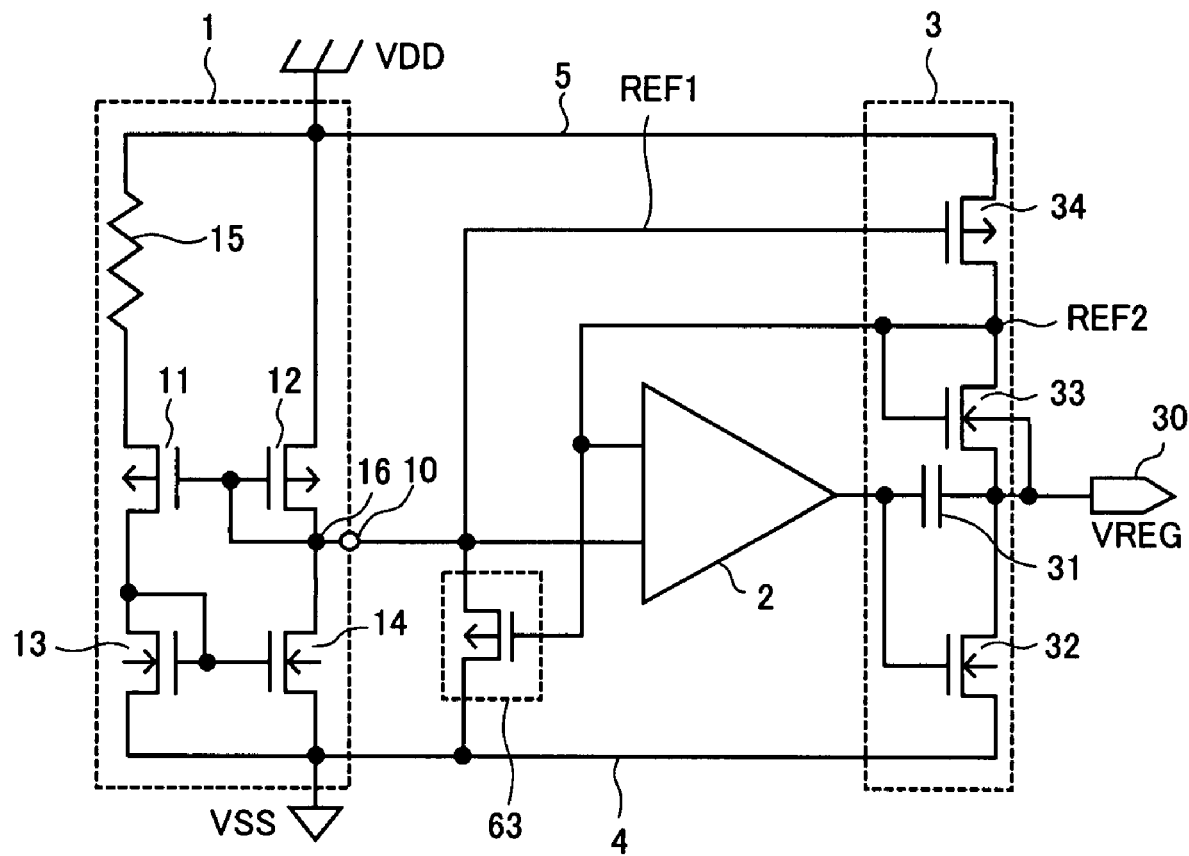
FIG. 5 is a circuit diagram showing a constant voltage generating circuit in a third embodiment of the present invention.

FIG. 5 is a circuit diagram showing the configuration of a constant voltage generating circuit in a third embodiment, in which the output terminal of the voltage generation source is connected to the negative power supply line for a fixed period of time immediately after the power is turned on.

Switching means 6 in the third embodiment comprises a PMOS transistor 63 as shown in FIG. 5, and the switching between the on-state and the off-state of this PMOS transistor 63 is controlled by the signal (potential input to another input terminal of the differential amplifier) in the constant voltage generating circuit. The switching between the open/close state of the PMOS transistor 63 is controlled by the potential applied to the transistor and, so, the third embodiment also eliminates the need for the switching control means 72 that is required in the conventional configuration.

The source, the gate, and the drain of the PMOS transistor 63 are connected, respectively, to an output node 16 (output terminal 10) of a reference voltage generation source 1, to another input terminal of a differential amplifier 2, and to a negative power supply line 4. The bulk of the PMOS transistor 63 is connected to a positive power supply line 5 or to the output node 16 (output terminal 10) of the reference voltage generation source 1.

That is, the first potential REF1 is applied to the source of the PMOS transistor 86, the second potential REF2 is applied to its gate, the negative power supply potential VSS is applied to the drain, and the positive power supply potential VDD or the first potential REF1 is applied to its bulk. The potential change in the parts when the constant voltage generating circuit shown in FIG. 5 is started is the same as that in the first embodiment, and its waveform diagram is as shown in FIG. 3.

In the third embodiment, the gate potential of a first PMOS transistor 11 and the gate potential of a second PMOS transistor 12 are controlled by the PMOS transistor 63 for a fixed period of time immediately after the power is turned on. Therefore, the PMOS transistor 63 has the function of the gate control means.

In addition, the PMOS transistor 63 connects the output node 16, which is the output terminal of the reference voltage generation source 1, to the negative power supply line 4 for a fixed period of time immediately after the power is turned on. Therefore, the PMOS transistor 63 has the function of the reference voltage control means.

As compared with the conventional configuration in which the switching means 71 comprises the NMOS transistor, the third embodiment has the advantage that, even if the power supply voltage varies because of an over current to a load connected to the system, the variation is difficult to be transmitted to the first potential REF1.

Fourth Embodiment

Figure 6:
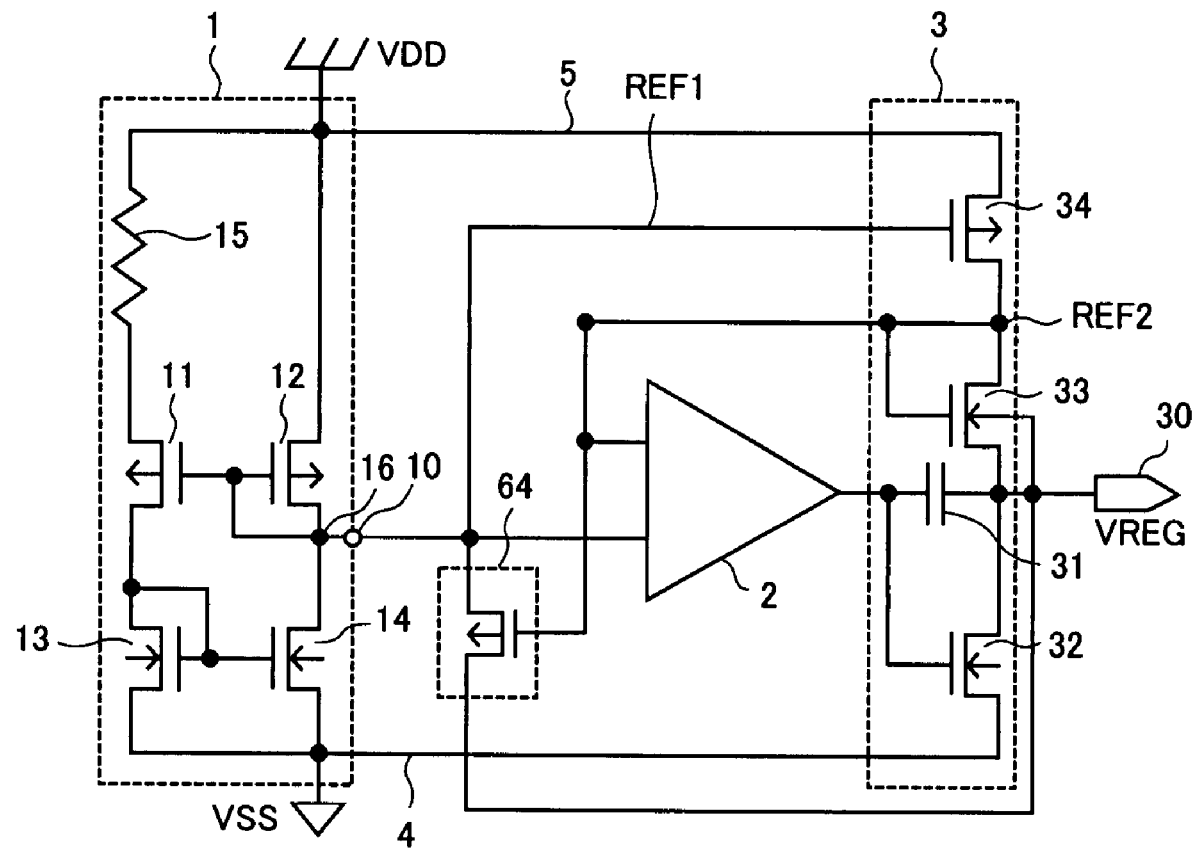
FIG. 6 is a circuit diagram showing a constant voltage generating circuit in a fourth embodiment of the present invention.

FIG. 6 is a circuit diagram showing the configuration of a constant voltage generating circuit in a fourth embodiment, in which the output terminal of the voltage generation source is connected to the regulator voltage output terminal for a fixed period of time immediately after the power is turned on.

Switching means 6 in the fourth embodiment comprises a PMOS transistor 64 as shown in FIG. 6, and the switching between the on-state and the off-state of this PMOS transistor 64 is controlled by the signal (potential input to another input terminal of the differential amplifier) in the constant voltage generating circuit. The switching between the open/close state of the PMOS transistor 64 is controlled by the potential applied to the transistor and, so, the fourth embodiment also eliminates the need for the switching control means 72 that is required in the conventional configuration.

The source, the gate, and the drain of the PMOS transistor 64 are connected, respectively, to an output node 16 (output terminal 10) of a reference voltage generation source 1, to another input terminal of a differential amplifier 2, and to a regulated voltage output terminal 35. The bulk of the PMOS transistor 64 is connected to a positive power supply line 5 or to the output node 16 of the reference voltage generation source 1. That is, the first potential REF1 is applied to the source of the PMOS transistor 64, the second potential REF2 is applied to its gate, the potential of the regulated voltage VREG is applied to the drain, and the positive power supply potential VDD or the first potential REF1 is applied to its bulk.

The potential change in the parts when the constant voltage generating circuit shown in FIG. 6 is started is the same as that in the first embodiment, and its waveform diagram is as shown in FIG. 3.

In the fourth embodiment, the gate potential of a first PMOS transistor 11 and the gate potential of a second PMOS transistor 12 are controlled by the PMOS transistor 64 for a fixed period of time immediately after the power is turned on. Therefore, the PMOS transistor 64 has the function of the gate control means. In addition, the PMOS transistor 64 connects the output node 16, which is the output terminal of the reference voltage generation source 1, to a regulated voltage output terminal 30 for a fixed period of time immediately after the power is turned on. Therefore, the PMOS transistor 64 has the function of the reference voltage control means.

Because the regulated voltage VREG is closer to the positive power supply potential VDD than to the negative power supply potential VSS, the fourth embodiment has the advantage that the leak current of the PMOS transistor 64 is smaller than the leak current of the PMOS transistor 63 in the third embodiment in the stable state, that is, when the PMOS transistor 64 is off.

Fifth Embodiment

Figure 7:
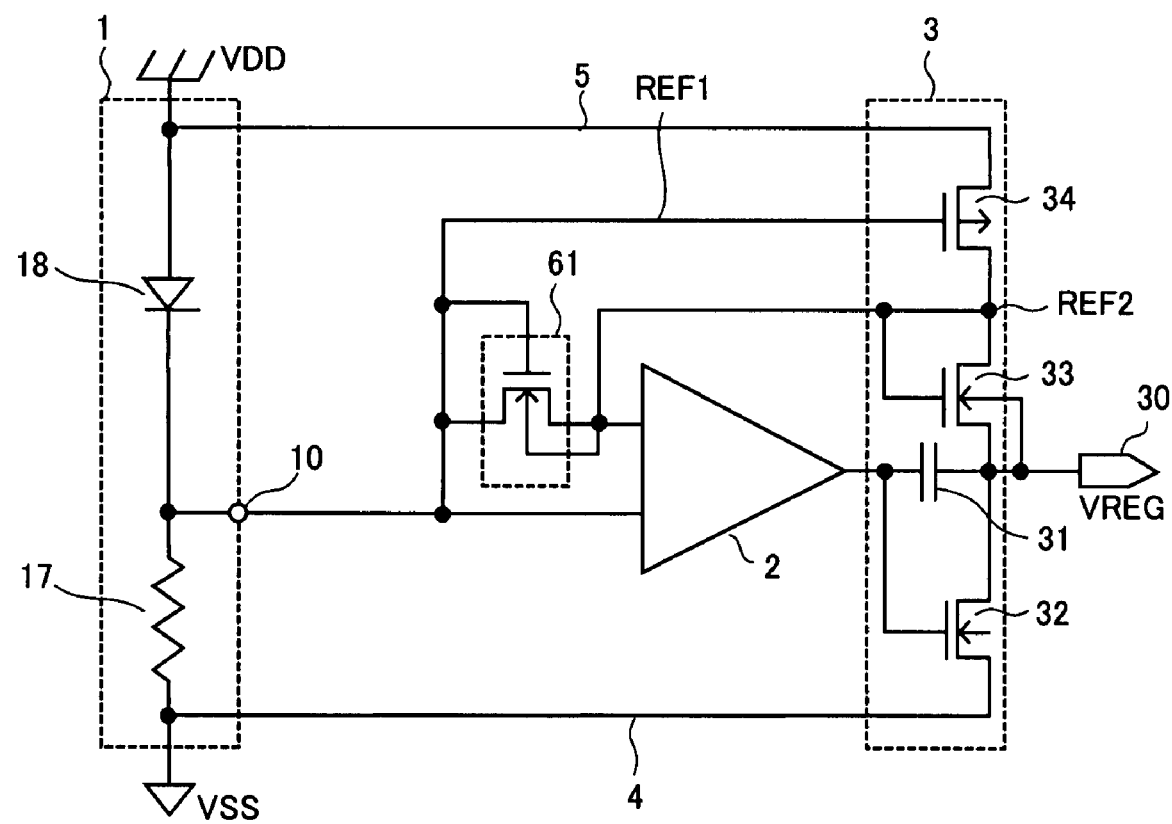
FIG. 7 is a circuit diagram showing, as a fifth embodiment, another circuit example of the constant voltage generating circuit in the first embodiment of the present invention.

FIG. 7 is a circuit diagram showing the configuration of a constant voltage generating circuit in a fifth embodiment in which, as in the first embodiment described above, the output terminal of the voltage generation source is connected to another input terminal of a differential amplifier for a fixed period of time immediately after the power is turned on. The fifth embodiment is an example of the configuration in which a constant voltage circuit, composed of a constant voltage diode and a resistor connected in series, is used as the reference voltage generation source instead of a current mirror circuit.

As shown in FIG. 7, the fifth embodiment has a circuit configuration similar to that shown in FIG. 2 except the configuration of the reference voltage generation source 1.

A reference voltage generation source 1 comprises a constant voltage circuit composed of a constant voltage diode 18 and a resistor 17 that are connected in series. The connection point between the resistor 17 and the constant voltage diode 18 is connected to an output terminal 10.

The gate and the drain of an NMOS transistor 61 are connected to the output terminal 10 of the reference voltage generation source 1.

The fifth embodiment operates in the same manner as the first embodiment described above. The potential of the connection point between the constant voltage diode 18 and the resistor 17 in the constant voltage circuit included in the reference voltage generation source 1 is controlled by the NMOS transistor 61 for a fixed period of time immediately after the power is turned on.

The NMOS transistor 61 connects the output terminal 10, which is the output terminal of the reference voltage generation source 1, to the input terminal, via which the second potential REF2 is input to a differential amplifier 2, for a fixed period of time immediately after the power is turned on. Therefore, the NMOS transistor 61 has the function of the reference voltage control means.

Although a current mirror circuit is used, or the configuration in which a constant voltage diode and a resistor are connected in series is used, as the reference voltage generation source in the examples described above, the present invention may be applied also to a constant voltage circuit with some other configuration. For example, a bipolar transistor may be provided between the constant voltage diode 18 and the resistor 17. In that case, the emitter of the bipolar transistor is connected to the constant voltage diode 18, the collector is connected to the resistor 17, and the base is connected to the output terminal 10.

Because the output potential REF1 of the reference voltage generation source 1 quickly becomes stable at a desired potential after the power is turned on in the embodiments as described above, the present invention achieves the effect of immediately outputting a desired, stable regulated voltage VREG. In addition, because no capacitor is connected between the output node 16, which is the output terminal of the reference voltage generation source 1, and the negative power supply line 4, the output of the reference voltage generation source 1 is not affected by power supply variations. Therefore, the present invention gives the effect that the regulated voltage VREG becomes stable.

The embodiments, whose power supply voltage is about 3V, are efficient for the constant voltage generating circuit of a low power-consumption, small electronic apparatus that is driven by a regulated voltage VREG about the half of the power supply power. For example, the embodiments are efficient for the constant voltage generating circuit built in a watch.

The present invention is not limited to those described above but various modifications are possible. For example, the basic configuration of the constant voltage generating circuit is not limited to the configuration shown in FIG. 8. The switching means 6 is not limited to a MOS transistor.

As described above, the constant voltage generating circuit according to the present invention is useful for a small electronic apparatus that is driven by a regulated voltage generated by lowering the power supply voltage. In particular, the constant voltage generating circuit is applicable to the watch in general, including a solar watch.

The invention claimed is:

1. A constant voltage generating circuit that outputs a regulator voltage obtained by lowering a power supply voltage, said constant voltage generating circuit comprising:
a reference voltage generation source that generates a reference voltage used for generating the regulator voltage based on the power supply voltage;
a differential amplifier that receives an output potential of said reference voltage generation source via one input terminal and receives a potential generated by adding a predetermined potential difference to a voltage of a regulator voltage output terminal via another input terminal to keep a potential of the regulator voltage output terminal at a constant potential based on the potentials received at the two input terminals; and switching means that controls the output potential so that an amount of a current at an output terminal of said reference voltage generation source increases for a fixed period of time immediately after the power is turned on wherein said switching means controls the output potential based on the potential received at said another input terminal of said differential amplifier.

2. The constant voltage generating circuit according to claim 1 wherein said switching means connects an output terminal of said reference voltage generation source to said another input terminal of said differential amplifier for the fixed period of time immediately after the power is turned on.

3. The constant voltage generating circuit according to claim 1 wherein said switching means connects an output terminal of said reference voltage generation source to a negative power supply line for the fixed period of time immediately after the power is turned on.

4. The constant voltage generating circuit according to claim 1 wherein said switching means connects an output terminal of said reference voltage generation source to said regulator voltage output terminal for the fixed period of time immediately after the power is turned on.

5. The constant voltage generating circuit according to one of claims 1-4 wherein said switching means includes an N-channel or P-channel transistor whose on-state and off-state switching are controlled based on the potential received at said another input terminal of said differential amplifier.

6. The constant voltage generating circuit according to one of claims 1-4 wherein said reference voltage generation source includes a current mirror circuit and said switching means controls gate potentials of transistors, which constitute said current mirror circuit, for the fixed period of time immediately after the power is turned on to increase an amount of current flowing in said current mirror circuit.

7. The constant voltage generating circuit according to one of claims 1-4 wherein said reference voltage generation source includes a series circuit composed of a constant voltage diode and a resistor connected to power supply voltages and said switching means controls a potential of a connection point between the constant voltage diode and the resistor, which constitute said serial circuit, for the fixed period of time immediately after the power is turned on to increase an amount of current flowing in said series circuit.

* * * * *